US012740101B2

(12) United States Patent
Lim et al.

(10) Patent No.: US 12,740,101 B2
(45) Date of Patent: Sep. 15, 2026

(54) SYNAPTIC ELEMENT FOR PERFORMING POLYNOMIAL OPERATION AND ELECTRONIC CIRCUIT INCLUDING THE SAME

(71) Applicant: Electronics and Telecommunications Research Institute, Daejeon (KR)

(72) Inventors: JungWook Lim, Daejeon (KR); Jieun Kim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 945 days.

(21) Appl. No.: 18/081,332

(22) Filed: Dec. 14, 2022

(65) Prior Publication Data

US 2023/0335649 A1 Oct. 19, 2023

(30) Foreign Application Priority Data

Apr. 15, 2022 (KR) ........................ 10-2022-0047001
Sep. 2, 2022 (KR) ........................ 10-2022-0111433

(51) Int. Cl.
*H10D 30/69* (2025.01)
*G06N 3/065* (2023.01)
(Continued)

(52) U.S. Cl.
CPC ........... *H10D 30/691* (2025.01); *G06N 3/065* (2023.01); *G11C 11/5671* (2013.01); *H10D 30/6755* (2025.01)

(58) Field of Classification Search
CPC ............. H10D 30/6755; H10D 30/691; G06N 3/06–065; G06F 7/5443;
(Continued)

(56) References Cited

U.S. PATENT DOCUMENTS 5,563,530 A 10/1996 Frazier et al.
10,957,937 B2 * 3/2021 Todorov ............... H10N 70/245
(Continued)

FOREIGN PATENT DOCUMENTS

CN 113675294 11/2021
EP 4050639 A1 * 8/2022 ............. G11C 11/40
(Continued)

OTHER PUBLICATIONS

Kobashi et al., "Multi-Valued Logic Circuits Based on Organic Anti-ambipolar Transistors", Nano Letters, 2018, pp. 4355-4359, vol. 18.

(Continued)

*Primary Examiner* — Matthew D Sandifer

(74) *Attorney, Agent, or Firm* — KILE PARK REED & HOUTTEMAN PLLC

(57) ABSTRACT

A synaptic element performing a multi-level logic operation includes a gate electrode to which a gate voltage pulse is applied, a first electrode, a second electrode, and a multi-layer tunnel insulating film in contact with each of the gate electrode, the first electrode, and the second electrode, and disposed such that the gate electrode is spaced apart from the first electrode and the second electrode, and the synaptic element generates a tunneling current flowing from the first electrode to the gate electrode through the multilayer tunnel insulating film based on the gate voltage pulse, the synaptic element operates in one of a turn-on mode, a turn-off mode, and an intermediate mode different from the turn-on mode and the turn-off mode based on the tunneling current, and the (Continued)

synaptic element is trained to generate a drain current in each of the turn-on mode, the turn-off mode, and the intermediate mode.

17 Claims, 6 Drawing Sheets

(51) Int. Cl.
*G11C 11/56* (2006.01)
*H10D 30/67* (2025.01)

(58) Field of Classification Search
CPC ...... G06F 2207/4824; G06G 7/16–161; G11C 11/56; G11C 11/5671
See application file for complete search history.

(56) References Cited

U.S. PATENT DOCUMENTS 11,195,087 B2 12/2021 Lee
11,462,647 B2 10/2022 Yu et al.
11,922,298 B2 3/2024 Park et al.
12,575,337 B2 * 3/2026 Woo ...................... H10N 70/24
2014/0067743 A1 3/2014 Park et al.
2021/0125063 A1 4/2021 Park
2022/0271135 A1 * 8/2022 Mizushima ............ G06N 3/008
2022/0285615 A1 * 9/2022 Woo ..................... H10N 70/011
2023/0169317 A1 * 6/2023 Choi ...................... G06N 3/049
706/26

FOREIGN PATENT DOCUMENTS

JP 3429821 7/2003
KR 10-2014-0032186 3/2014
KR 10-2018-0133073 12/2018
KR 10-2020-0026626 3/2020
KR 10-2128474 6/2020
KR 10-2196523 12/2020
KR 10-2234174 4/2021
KR 10-2022-0021839 2/2022

OTHER PUBLICATIONS

Lim et al., “Double Negative Differential Transconductance Characteristic: From Device to Circuit Application toward Quaternary Inverter”, Advanced Functional Materials, 2019, pp. 1-8, vol. 29.

* cited by examiner

SYNAPTIC ELEMENT FOR PERFORMING POLYNOMIAL OPERATION AND ELECTRONIC CIRCUIT INCLUDING THE SAME

CROSS-REFERENCE TO RELATED APPLICATIONS

This application claims priority under 35 U.S.C. § 119 to Korean Patent Application Nos. 10-2022-0047001, filed on Apr. 15, 2022, and 10-2022-0111433, filed on Sep. 2, 2022, respectively, in the Korean Intellectual Property Office, the disclosures of which are incorporated by reference herein in their entireties.

BACKGROUND

Embodiments of the present disclosure described herein relate to a synaptic element for performing a multi-level logic operation and an electronic circuit including the same, and more particularly, relate to a synaptic element that performs a multi-level logic operation capable of training about light and electrical stimulation while performing a multi-level logic operation that is more than ternary, and an electronic circuit including the same.

In modern society, the amount of information to be processed by semiconductor devices increases, and fast information processing speed of semiconductor devices is required. However, in the case of semiconductor devices, high integration has progressed, and the line width of design rules has continuously decreased, so they are almost reaching the physical limit. Therefore, it is difficult for conventional semiconductor devices to perform learning of deep learning methods based on an artificial intelligence and to process vast amounts of information of big data.

In addition, although the era of artificial intelligence computers winning over humans has opened through AlphaGo, the conventional semiconductor devices require a huge amount of power and considerable information processing time. Therefore, at this point, a low-power and effective learning methods are required, and synaptic elements that mimic synapses in the human brain are being developed, but it is difficult to find stable materials for mass production of synaptic elements.

SUMMARY

Embodiments of the present disclosure provide a synaptic element capable of performing ternary or higher multi-level logic operation, and performing a multi-level logic operation and simultaneously performing a multi-level logic operation that can have synaptic characteristics, and an electronic circuit including the same.

According to an embodiment of the present disclosure, a synaptic element performing a multi-level logic operation includes a gate electrode to which a gate voltage pulse is applied, a first electrode, a second electrode, and a multilayer tunnel insulating film in contact with each of the gate electrode, the first electrode, and the second electrode, and disposed such that the gate electrode is spaced apart from the first electrode and the second electrode, and the synaptic element generates a tunneling current flowing from the first electrode to the gate electrode through the multilayer tunnel insulating film based on the gate voltage pulse, the synaptic element operates in one of a turn-on mode, a turn-off mode, and an intermediate mode different from the turn-on mode and the turn-off mode based on the tunneling current, and the synaptic element is trained to generate a drain current in each of the turn-on mode, the turn-off mode, and the intermediate mode.

According to an embodiment, a drain voltage may be applied to the first electrode, and a magnitude of the drain current generated based on the gate voltage pulse may vary depending on a level of the drain voltage.

According to an embodiment, the synaptic element may generate a drain current having a first value when a first drain voltage is applied, and the synaptic element may be trained to generate a drain current having a second value greater than the first value when a second drain voltage having a level greater than that of the first drain voltage is applied.

According to an embodiment, the synaptic element may be trained to generate a first drain current when a first gate voltage pulse is applied to the gate electrode, and when the number of the first gate voltage pulses increases, the synaptic element may be trained such that the first drain current increases linearly by a first value in proportion to an increase in the number of the first gate voltage pulses.

According to an embodiment, the synaptic element may be trained to generate a second drain current when a second gate voltage pulse different from the first gate voltage pulse is applied to the gate electrode, and when the number of the second gate voltage pulses increases, the synaptic element may be trained such that the second drain current decreases linearly by a second value in proportion to an increase in the number of the second gate voltage pulses.

According to an embodiment, a polarity of the second gate voltage pulse may be opposite to that of the first gate voltage pulse.

According to an embodiment, the level of the second gate voltage pulse may be the same as the level of the first gate voltage pulse, and the second value may be the same as the first value.

According to an embodiment, the synaptic element may be trained to generate a third drain current when a third gate voltage pulse having a pulse intensity lower than that of the first gate voltage pulse is applied to the gate electrode, and when the number of the third gate voltage pulses increases, the synaptic element may be trained such that the third drain current linearly increases by a third value less than the first value in proportion to an increase in the number of the third gate voltage pulses.

According to an embodiment of the present disclosure, an electronic circuit including a synaptic element that performs a multi-level logic operation, includes the synaptic element and a variable resistor, and the synaptic element includes a gate electrode connected to an input terminal, a first electrode, a second electrode connected to one end of the variable resistor and an output terminal, and a multilayer tunnel insulating film in contact with each of the gate electrode, the first electrode, and the second electrode, and disposed such that the gate electrode is spaced apart from the first electrode and the second electrode, and the synaptic element generates a tunneling current flowing from the first electrode to the gate electrode through the multilayer tunnel insulating film based on a gate voltage pulse applied to the gate electrode through the input terminal, the synaptic element operates in one of a turn-on mode, a turn-off mode, and an intermediate mode different from the turn-on mode and the turn-off mode based on the tunneling current, the synaptic element is trained to generate a drain current in each of the turn-on mode, the turn-off mode, and the intermediate mode, and synaptic element controls an output voltage output to the output terminal through the second electrode based on the drain current and a resistance value of the variable resistor.

According to an embodiment, a drain voltage may be applied to the first electrode, and a magnitude of the drain current generated based on the gate voltage pulse may vary depending on a level of the drain voltage.

According to an embodiment, the synaptic element may generate a drain current having a first value when a first drain voltage is applied, and the synaptic element may be trained to generate a drain current having a second value greater than the first value when a second drain voltage having a level greater than that of the first drain voltage is applied.

According to an embodiment, the synaptic element may be trained to generate a first drain current when a first gate voltage pulse is applied to the gate electrode, and when the number of the first gate voltage pulses increases, the synaptic element may be trained such that the first drain current increases linearly by a first value in proportion to an increase in the number of the first gate voltage pulses.

According to an embodiment, the synaptic element may be trained to generate a second drain current when a second gate voltage pulse different from the first gate voltage pulse is applied to the gate electrode, and when the number of the second gate voltage pulses increases, the synaptic element may be trained such that the second drain current decreases linearly by a second value in proportion to an increase in the number of the second gate voltage pulses.

According to an embodiment, a polarity of the second gate voltage pulse may be opposite to that of the first gate voltage pulse.

According to an embodiment, an intensity of the second gate voltage pulse may be the same as an intensity of the first gate voltage pulse, and the second value may be the same as the first value.

According to an embodiment, the synaptic element may be trained to generate a third drain current when a third gate voltage pulse having a pulse intensity lower than that of the first gate voltage pulse is applied to the gate electrode, and when the number of the third gate voltage pulses increases, the synaptic element may be trained such that the third drain current linearly increases by a second value less than the first value in proportion to an increase in the number of the third gate voltage pulses.

According to an embodiment, when the resistance value of the variable resistor increases and a first drain voltage is applied to the first electrode, the synaptic element may allow a first output voltage having a first intensity to be output to the output terminal, and when the resistance value of the variable resistor increases and a second drain voltage having an intensity lower than that of the first drain voltage is applied to the first electrode, the synaptic element may allow a second output voltage having a second intensity lower than the first intensity to be output to the output terminal.

BRIEF DESCRIPTION OF THE FIGURES

The above and other objects and features of the present disclosure will become apparent by describing in detail embodiments thereof with reference to the accompanying drawings.

DETAILED DESCRIPTION

Hereinafter, embodiments of the present disclosure will be described in detail and clearly to such an extent that an ordinary one in the art easily implements the present disclosure.

Figure 1:
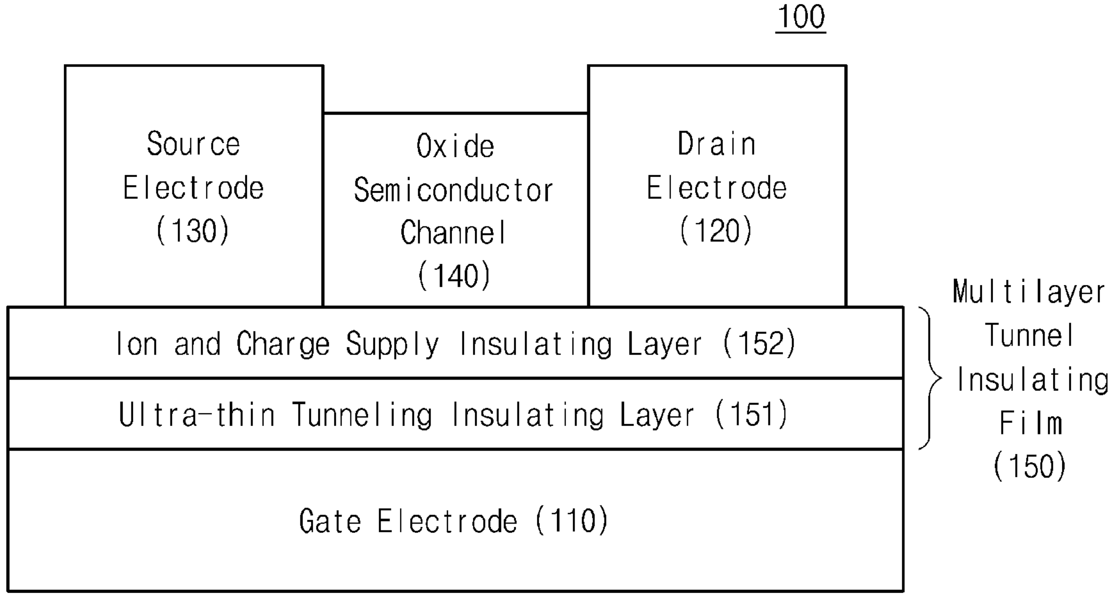
FIG. 1 is a diagram illustrating a cross-section of a synaptic element according to an embodiment of the present disclosure.

FIG. 1 is a diagram illustrating a cross-section of a synaptic element 100 according to an embodiment of the present disclosure. Referring to FIG. 1, the synaptic element 100 may include a gate electrode 110, a drain electrode 120, a source electrode 130, an oxide semiconductor channel 140, and a multilayer tunnel insulating film 150.

The gate electrode 110 may be deposited on a semiconductor substrate (not illustrated) in the synaptic element 100. Alternatively, the gate electrode 110 may include a semiconductor substrate (not illustrated). However, it is not limited thereto, and the gate electrode 110 may be spaced apart from a semiconductor substrate (not illustrated).

Hereinafter, the gate electrode 110 will be described based on being deposited on top of a semiconductor substrate (not illustrated).

Materials of the semiconductor substrate (not illustrated) include silicon, silicon oxide, major metals, compound semiconductors, glass, polyimide, polyethylene terephthalate (PET), polyethylene naphthalate (PEN), triacetyl cellulose (TAC), and metal foils. However, examples that can be a material of the semiconductor substrate (not illustrated) of the present disclosure are not limited thereto.

The gate electrode 110 may include not only highly doped silicon, but also major metals of aluminum (Al), silver (Ag), gold (Au), platinum (Pt), molybdenum (Mo), nickel (Ni), and tin (TiN), or transparent electrodes of Indium Tin Oxide (ITO), AlOx-ZnO (AlZnO), GaOx-ZnO (GaZnO), and SnO2. However, examples that can be a material of the gate electrode 110 of the present disclosure are not limited thereto.

The drain electrode 120 may include materials similar to those of the aforementioned gate electrode 110. However, examples that can be a material of the drain electrode 120 of the present disclosure are not limited thereto.

The source electrode 130 may include materials similar to those of the aforementioned gate electrode 110. However, examples that can be a material of the source electrode 130 of the present disclosure are not limited thereto.

The oxide semiconductor channel 140 may include oxides of TiO2, In2O3, SnO2, ZnO, InTiO, SnTiO, ZnTiO, InSnO, ZnSnO, and InZnO, and may also include silicon crystalline and thin film semiconductors. However, examples that can be a material of the oxide semiconductor channel 140 of the present disclosure are not limited thereto.

The oxide semiconductor channel 140 may be positioned between the drain electrode 120 and the source electrode 130. In more detail, the oxide semiconductor channel 140 may be disposed such that the drain electrode 120 and the source electrode 130 are separated from each other while contacting the drain electrode 120 and the source electrode 130.

The multilayer tunnel insulating film 150 may include an ultra-thin tunneling insulating layer 151 and an ion and charge supply insulating layer 152. However, the multilayer tunnel insulating film 150 may be formed of a single layer of the ultra-thin tunneling insulating layer 151. Hereinafter, the multilayer tunnel insulating layer 150 will be described as including the ultra-thin tunneling insulating layer 151 and the ion and charge supply insulating layer 152.

The ultra-thin tunneling insulating layer 151 may include both oxides and sulfides that form ionic bonds. The thickness of the ultra-thin tunneling insulating layer 151 may be greater than or equal to 1 nm and less than or equal to 50 nm. However, the material and thickness of the ultra-thin tunneling insulating layer 151 may not be limited thereto.

The ion and charge supply insulating layer 152 is an oxide or a sulfide, and may be an insulating layer that supplies at least one of electrons, holes, ions, and vacancies. However, examples that can be a material of the ion and charge supply insulating layer 152 of the present disclosure are not limited thereto.

The ultra-thin tunneling insulating layer 151 may be configured to form a deep trap region (not illustrated) at an interface between the oxide semiconductor channel 140 and the ultra-thin tunneling insulating layer 151. The deep trap region (not illustrated) may be configured to trap and store electrons or holes.

Electrons, holes, or ions generated by the ion and charge supply insulating layer 152, or electrons or holes of the oxide semiconductor channel 140 may be trapped and stored in the deep trap region (not illustrated). In addition, the oxide semiconductor channel 140 may photo-generate electrons or holes in response to ultraviolet rays and visible rays, and the photogenerated electrons or holes may also be trapped and stored in the deep trap region (not illustrated).

Therefore, the synaptic element 100 traps and stores electrons or holes generated from the ion and charge supply insulating layer 152 and the oxide semiconductor channel 140 to have synaptic properties for performing memory and learning on information processing.

The ultra-thin tunneling insulating layer 151 may be disposed to separate the gate electrode 110 and the drain electrode 120 from each other. The ultra-thin tunneling insulating layer 151 may be disposed to separate the gate electrode 110 and the source electrode 130 from each other.

However, when the multilayer tunnel insulating film 150 is composed of a single layer of the ultra-thin tunneling insulating layer 151, the ultra-thin tunneling insulating layer 151 may be disposed to separate the gate electrode 110 and the drain electrode 120 from each other while contacting the gate electrode 110 and the drain electrode 120. In addition, the ultra-thin tunneling insulating layer 151 may be disposed to separate the gate electrode 110 and the source electrode 130 from each other while contacting the gate electrode 110 and the source electrode 130.

A tunneling current flowing from the drain electrode 120 to the gate electrode 110 through the ultra-thin tunneling insulating layer 151 may be generated depending on a level of a gate input voltage VIN applied to the gate electrode 110.

Tunneling occurring in the ultra-thin tunneling insulating layer 151 may include an F-N tunneling and a direct tunneling. The tunneling may be formed by a Schottky junction that occurs when the work function of the drain electrode 120 and the gate electrode 110 is greater than the work function of the ultra-thin tunneling insulating layer 151.

The synaptic element 100, when a tunneling current is generated, may operate in an intermediate mode other than a turn-on mode or a turn-off mode.

The synaptic element 100 may generate a drain current ID in each of the turn-on mode, the turn-off mode, and the intermediate mode. Therefore, it is possible to perform ternary operation as it operates in three operation modes: the turn-on mode, the turn-off mode, and the intermediate mode. However, the synaptic element 100 is not limited thereto, and the synaptic element 100 may further perform a 4-digit or higher multi-level logic operation depending on a level of the gate input voltage VIN applied to the gate electrode 110.

The synaptic element 100 may simultaneously perform the multi-level logic operation while having the aforementioned synaptic characteristics. A detailed description of this will be given later.

Figure 2:
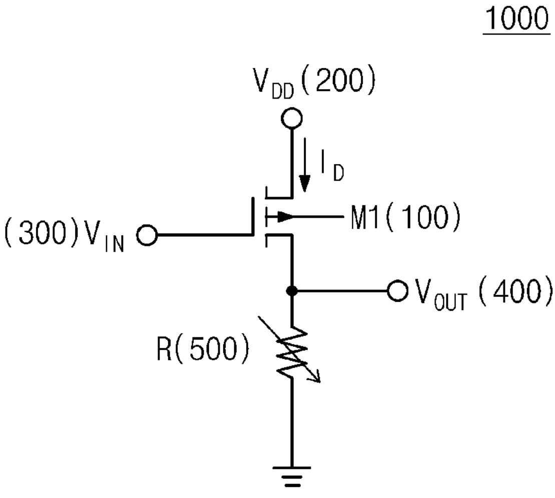
FIG. 2 is a diagram illustrating an electronic circuit including synaptic element.

FIG. 2 is a diagram illustrating an electronic circuit 1000 including the synaptic element 100. As an example, the synaptic element 100 of FIG. 2 may correspond to the synaptic element 100 of FIG. 1. Therefore, descriptions of similar operations for each of the corresponding components will be omitted to avoid redundancy.

Referring to FIGS. 1 and 2, the electronic circuit 1000 may include the synaptic element 100, a power supply terminal 200 connected to a first electrode of the synaptic element 100, an input terminal 300 connected the gate electrode 110 of the synaptic element 100, an output terminal 400 connected to a second electrode of the synaptic element 100, and a variable resistor (R) 500 having one end connected to the output terminal 400.

The first electrode connected to the power supply terminal 200 and the second electrode connected to the output terminal 400 may respectively correspond to the drain electrode 120 and the source electrode 130 according to voltage bias. However, the present disclosure is not limited thereto, and the first electrode may be the source electrode 130 and the second electrode may be the drain electrode 120.

A drain voltage VDD may be applied through the power terminal 200 connected to the drain electrode 120. When a level of the drain voltage VDD is applied while varying, the synaptic element 100 may be trained to generate the drain current ID having a different value.

The gate input voltage VIN may be applied through the input terminal 300 connected to the gate electrode 110. However, the present disclosure is not limited thereto, and electrical stimulation through gate voltage pulses or light stimulation through light pulses may be applied to the input terminal 300. A detailed description of a configuration in which the synaptic element 100 receives a gate voltage pulse and simultaneously performs a multi-level logic operation while having synaptic characteristics will be described later.

An output voltage VOUT may be output through the output terminal 400 connected to the source electrode 130. The output voltage VOUT may be controlled based on the drain current ID generated based on tunneling.

The other end of the variable resistor (R) 500 may be connected to a ground terminal (not illustrated). The level of the output voltage VOUT output to the output terminal 400 may vary depending on a resistance value of the variable resistor (R) 500. A detailed description of a configuration for controlling the output voltage VOUT output to the output terminal 400 based on the drain current ID and the resistance value of the variable resistor (R) 500 will be described later.

Although not illustrated, in the synaptic element 100, a 3-terminal transistor may be connected in series to the source electrode 130 instead of the variable resistor (R) 500. In this case, depending on a threshold voltage of the 3-terminal transistor and a polarity (whether n-type or p-type) of the 3-terminal transistor, the synaptic element 100 has synaptic characteristics and may simultaneously perform ternary or more multi-level logic operation.

Figure 3:
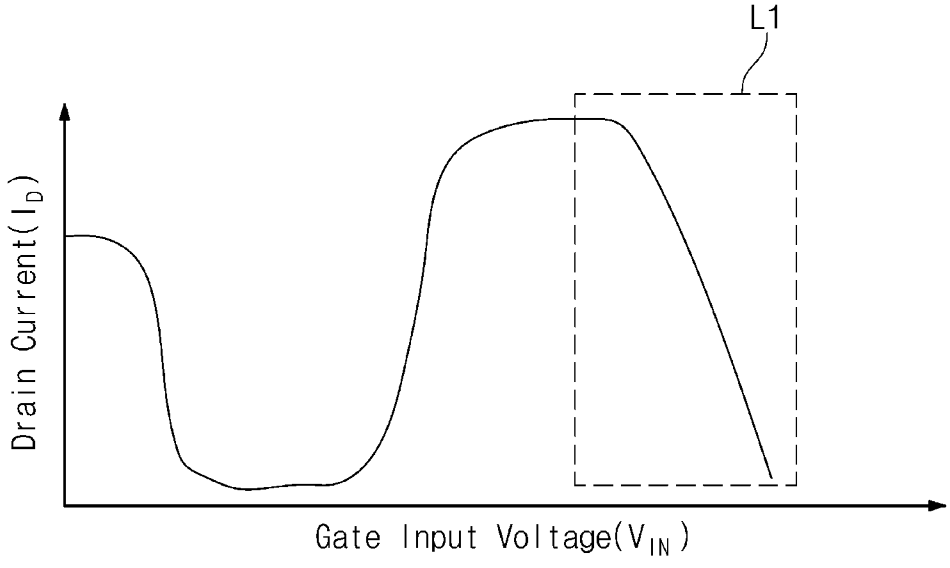
FIG. 3 is a graph illustrating a relationship between a gate input voltage VIN and a drain current ID.

FIG. 3 is a graph illustrating a relationship between the gate input voltage VIN and the drain current ID. Referring to FIGS. 1 to 3, L1 region represents a relationship between the gate input voltage VIN and the drain current ID when the gate input voltage VIN is a high voltage.

The drain current ID rapidly decreases as the gate input voltage VIN increases in the L1 region indicated by the dotted box where the gate input voltage VIN is a high voltage. The voltage-current characteristic curve of a negative resistance may be due to a tunneling current generated based on a difference in work function between the aforementioned gate electrode 110 and the drain electrode 120, and the ultra-thin tunneling insulating layer 151.

Figure 4:
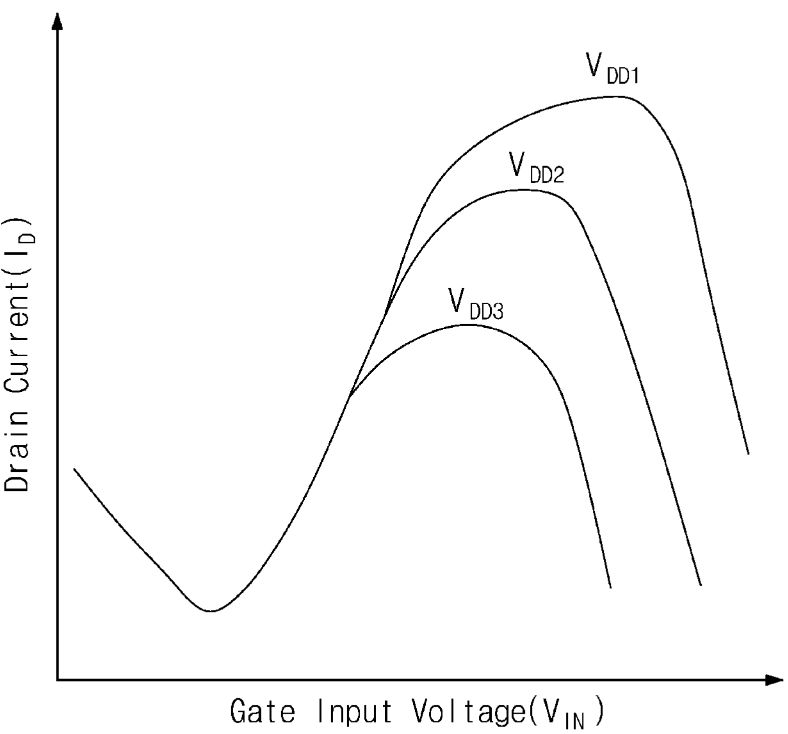
FIG. 4 is a graph illustrating a relationship between a gate input voltage VIN and a drain current ID according to a level of a drain voltage VDD.

FIG. 4 is a graph illustrating a relationship between the gate input voltage VIN and the drain current ID according to a level of the drain voltage VDD. The graph of FIG. 4 may include a voltage-current characteristic curve of the negative resistance as in the graph of FIG. 3.

For example, in FIG. 4, a configuration in which first to third drain voltages VDD1 to VDD3 having different levels among the drain voltages VDD of FIG. 2 are applied through the power supply terminal 200 will be described. However, it is not limited thereto, and fourth to n-th drain voltages having different levels may be further applied through the power supply terminal 200.

Referring to FIGS. 1 to 4, the synaptic element 100 may change a F-N tunneling barrier depending on the levels of the applied drain voltage VDD, and may control the amount of drain current based on the tunneling current flowing through the ultra-thin tunneling insulating layer 151.

For example, the level of the first drain voltage VDD1 applied through the power supply terminal 200 may be greater than the level of the second drain voltage VDD2, and the level of the second drain voltage VDD2 may be greater than the level of the third drain voltage VDD3.

In this case, a first value of the drain current ID generated when the first drain voltage VDD1 is applied may be greater than a second value of the drain current ID generated when the second drain voltage VDD2 lesser than the first drain voltage VDD1 is applied.

As in the above description, the second value of the drain current ID generated when the second drain voltage VDD2 is applied may be greater than a third value of the drain current ID generated when the third drain voltage VDD3 lesser than the second drain voltage VDD2 is applied.

Accordingly, the synaptic element 100 may be trained to generate drain currents ID having different values based on the first to third drain voltages VDD3.

Figure 5:
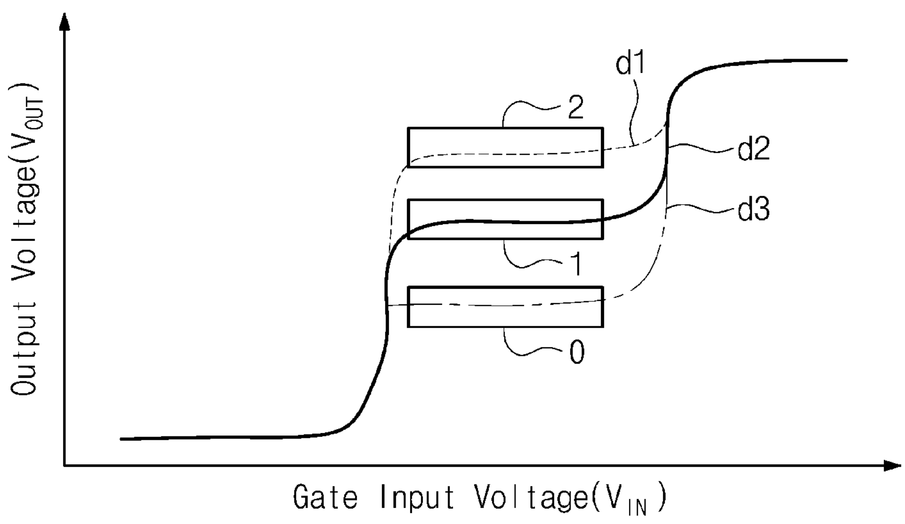
FIG. 5 is a graph illustrating a relationship between a gate input voltage VIN and an output voltage VOUT.

FIG. 5 is a graph illustrating a relationship between a gate input voltage VIN and an output voltage VOUT. Referring to FIGS. 1 to 5, d1 to d3 illustrates a configuration in which the level and width of the output voltage VOUT is controlled in the intermediate mode of the synaptic element 100.

There may be regions in which the output voltage VOUT output to the output terminal 400 of the synaptic element 100 is maintained uniform without increasing or decreasing. A region where the lowest output voltage VOUT is output may be defined as "0". A region where the highest output voltage VOUT is output may be defined as "2". A region where the output voltage VOUT of medium level is output may be defined as "1". In this case, the synaptic element 100 may perform a ternary operation through the output voltage VOUT output at different levels.

The synaptic element 100 may control the drain current ID based on the applied drain voltage VDD, and thus may control the output voltage VOUT based on the drain voltage VDD.

For example, the d1 may correspond to the level and width of the output voltage VOUT when the first drain voltage VDD1 of FIG. 4 is applied. The d2 may correspond to the level and width of the output voltage VOUT when the second drain voltage VDD2 of FIG. 4 is applied. The d3 may correspond to the level and width of the output voltage VOUT when the third drain voltage VDD3 of FIG. 4 is applied.

However, the drain voltage VDD respectively corresponding to d1 to d3 may vary depending on the resistance value of the variable resistor (R) 500 without being limited thereto.

Hereinafter, FIGS. 6A to 6C, FIG. 7, and FIG. 8 disclose a configuration in which gate voltage pulses are applied to the gate electrode 110 of the synaptic element 100 of FIG. 1. However, even when optical stimulation by light pulses as well as gate voltage pulses are applied, the synaptic element 100 may simultaneously perform the multi-level logic operation while having synaptic characteristics.

Figure 6A:
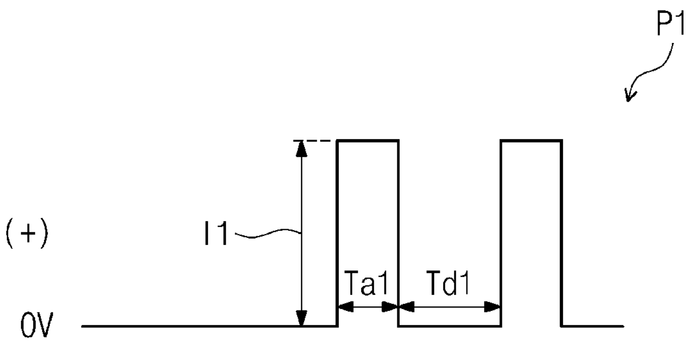
FIG. 6A is a diagram illustrating a first gate voltage pulse P1.

FIG. 6A is a diagram illustrating a first gate voltage pulse P1. For example, in FIG. 6A, Ta1 may denote a time interval at which a first pulse of the first gate voltage pulses P1 is applied, and Td1 may denote a time interval between a removal time of the first pulse and an application time of the second pulse.

Referring to FIG. 6A, the first gate voltage pulse P1 may be a voltage pulse having a polarity of (+) and a level of I1.

Figure 6B:
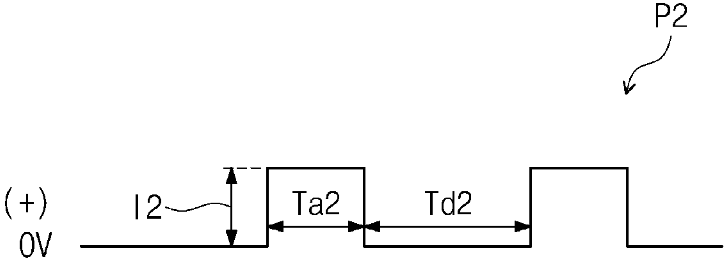
FIG. 6B is a diagram illustrating a second gate voltage pulse P2.

FIG. 6B is a diagram illustrating a second gate voltage pulse P2. For example, in FIG. 6B, Ta2 may denote a time interval at which a first pulse of the second gate voltage pulses P2 is applied, and Td2 may denote a time interval between a removal time of the first pulse and an application time of the second pulse. The second gate voltage pulse P2 may be a voltage pulse having a polarity of (+) and a level of I2.

Referring to FIGS. 6A and 6B, the I2 value may be less than the I1 value. For example, the level of the second gate voltage pulse P2 may be half that of the first gate voltage pulse P1. However, it is not limited thereto, and the level of the second gate voltage pulse P2 may be more than half or less than half of the level of the first gate voltage pulse P1.

Figure 6C:
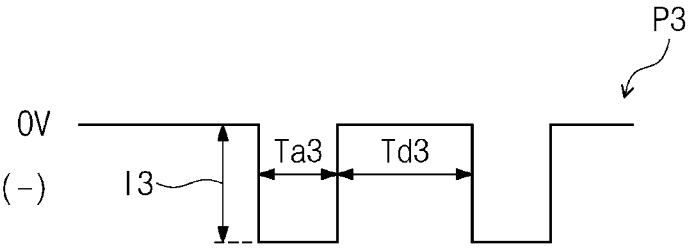
FIG. 6C is a diagram illustrating a third gate voltage pulse P3.

FIG. 6C is a diagram illustrating a third gate voltage pulse P3. For example, in FIG. 6C, Ta3 may denote a time interval at which a first pulse of the third gate voltage pulse P3 is applied, and Td3 may denote a time interval between a removal time of the first pulse and an application time of the second pulse. The third gate voltage pulse P3 may be a voltage pulse having a polarity of (+) and a level of I3.

Referring to FIGS. 1, 6A, and 6C, the value of I3 may be the same as the value of I1. For example, the third gate voltage pulse P3 may be a voltage pulse applied to the gate electrode 110 of the synaptic element 100 by changing only the polarity from the first gate voltage pulse P1. However, it is not limited thereto, and the level of the third gate voltage pulse P3 may be different from the level of the first gate voltage pulse P1.

Figure 7:
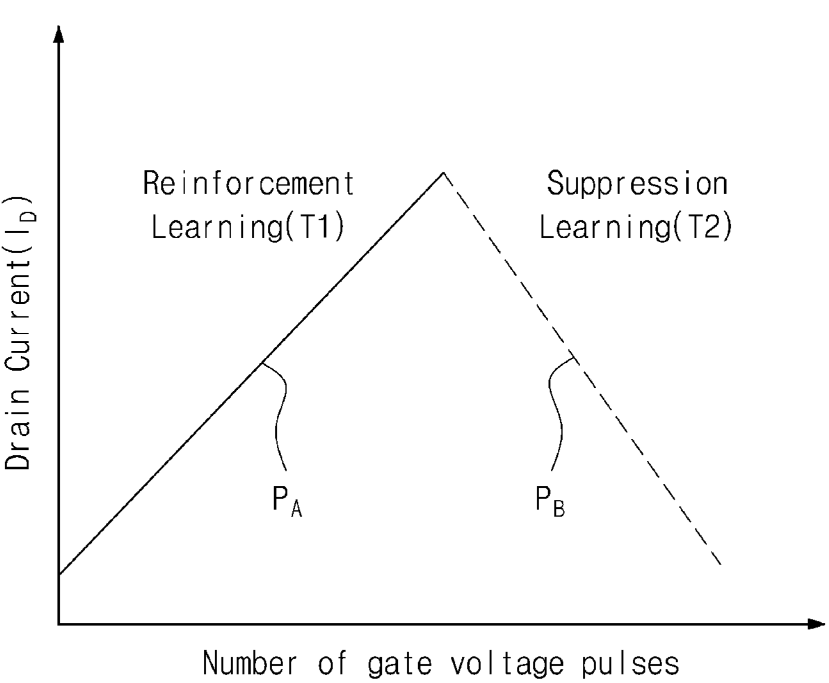
FIG. 7 is a graph illustrating a first relationship between the number of gate voltage pulses and a drain current ID.

FIG. 7 is a graph illustrating a first relationship between the number of gate voltage pulses and the drain current ID. For example, in FIG. 7, PA means a positive gate voltage pulse and PBmeans a negative gate voltage pulse.

Referring to FIGS. 1, 6*a* to 6*c*, and 7, when a positive gate voltage pulse PA is applied to the gate electrode 110 and the number of positive gate voltage pulses PA increases, the synaptic device 100 may perform reinforcement learning T1 in which the amount of drain current generated is linearly increased in proportion to the number of pulses.

When the first gate voltage pulse P1 of FIG. 6A or the second gate voltage pulse P2 of FIG. 6B is applied, the synaptic element 100 may perform the reinforcement learning T1. However, the synaptic element 100 may perform the reinforcement learning of different degrees when the intensity of the applied positive gate voltage pulse PA is different. A detailed configuration thereof will be described later with reference to FIG. 8.

When the negative gate voltage pulse PB is applied to the gate electrode 110 and the number of negative gate voltage pulses PB increases, the synaptic device 100 may perform suppression learning T2 in which the amount of drain current generated is linearly decreased in proportion to the number of pulses.

When the third gate voltage pulse P3 of FIG. 6C is applied, the synaptic device 100 may perform the suppression learning T2. When the third gate voltage pulse P3 of FIG. 6C has a different polarity and the same intensity as the first gate voltage pulse P1 of FIG. 6A, the curve of the reinforcement learning T1 and the curve of the suppression learning T2 may have symmetry with each other.

Figure 8:
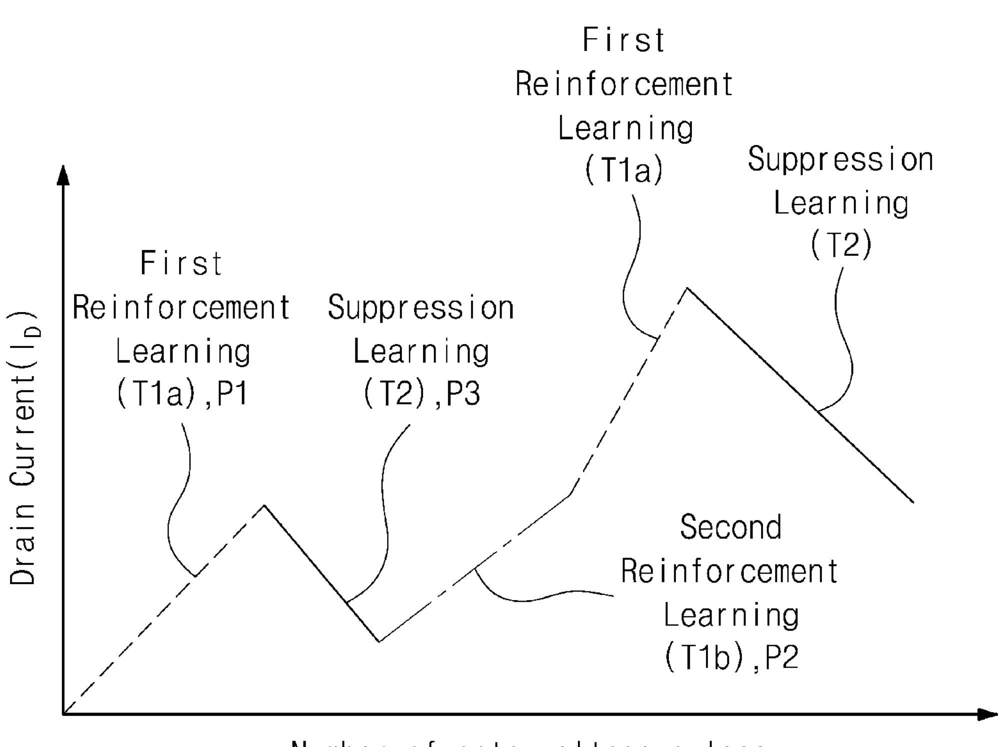
FIG. 8 is a graph illustrating a second relationship between the number of gate voltage pulses and a drain current ID.

FIG. 8 is a graph illustrating a second relationship between the number of gate voltage pulses and the drain current ID.

Referring to FIGS. 1 to 8, when the first gate voltage pulse P1 is applied to the gate electrode 110 of the synaptic element 100, the synaptic element 100 may perform a first reinforcement learning T1*a*. The first reinforcement learning T1*a* may mean learning to generate the drain current ID based on the first gate voltage pulse P1, and to linearly increase the generated drain current by a first value in proportion to the increase in the number of pulses when the number of positive first gate voltage pulses P1 increases.

When the third gate voltage pulse P3 is applied to the gate electrode 110 of the synaptic element 100, the synaptic element 100 may perform the suppression learning T2. The suppression learning T2 may mean learning to generate the drain current ID based on the third gate voltage pulse P3, and to linearly decrease the generated drain current by a second value in proportion to the increase in the number of pulses when the number of negative third gate voltage pulses P3 increases.

As described above, when the intensity of the third gate voltage pulse P3 is the same as that of the first gate voltage pulse P1, the suppression learning T2 may mean learning of the same intensity as the first reinforcement learning T1*a*.

When the second gate voltage pulse P2 is applied to the gate electrode 110 of the synaptic element 100, the synaptic element 100 may perform a second reinforcement learning T1*b*. The second reinforcement learning T1*b* may mean learning to generate the drain current ID based on the second gate voltage pulse P2, and to linearly increase the generated drain current by a third value in proportion to the increase in the number of pulses when the number of positive second gate voltage pulses P2 increases.

As described above, since the intensity of the second gate voltage pulse P2 is less than that of the first gate voltage pulse P1, the second reinforcement learning T1*b* may mean reinforcement learning with a lower intensity than the first reinforcement learning T1*a*. In detail, the third value at which the amount of drain current increases based on the second gate voltage pulse P2 may be less than the first value at which the amount of drain current increases based on the first gate voltage pulse P1.

In FIG. 8, the synaptic element 100 may sequentially perform the first reinforcement learning T1*a* and the suppression learning T2 after performing the second reinforcement learning T1*b*. However, without being limited thereto, the synaptic element 100 may determine the learning type based on the polarity and intensity of the gate voltage pulse applied to the gate electrode 110.

According to an embodiment of the present disclosure, ternary or higher multi-level logic operation is possible with fewer semiconductor devices, thereby reducing the burden of high integration of semiconductor devices. In addition, it is possible to increase the information processing speed and increase the amount of information processing while using only minimal power through the synaptic element.

The above description refers to embodiments for implementing the present disclosure. Embodiments in which a design is changed simply or which are easily changed may be included in the present disclosure as well as an embodiment described above. In addition, technologies that are easily changed and implemented by using the above embodiments may be included in the present disclosure. While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A synaptic element which performs a multi-level logic operation, the synaptic element comprising:

a gate electrode to which a gate voltage pulse is applied;

a first electrode;

a second electrode; and a multilayer tunnel insulating film in contact with each of the gate electrode, the first electrode, and the second electrode, and disposed such that the gate electrode is spaced apart from the first electrode and the second electrode, and wherein the synaptic element generates a tunneling current flowing from the first electrode to the gate electrode through the multilayer tunnel insulating film based on the gate voltage pulse, wherein the synaptic element operates in one of a turn-on mode, a turn-off mode, and an intermediate mode different from the turn-on mode and the turn-off mode based on the tunneling current, and wherein the synaptic element is trained to generate a drain current in each of the turn-on mode, the turn-off mode, and the intermediate mode.

2. The synaptic element of claim 1, wherein a drain voltage is applied to the first electrode, and wherein a magnitude of the drain current generated based on the gate voltage pulse varies depending on a level of the drain voltage.

3. The synaptic element of claim 2, wherein the synaptic element generates a drain current having a first value when a first drain voltage is applied, and wherein the synaptic element is trained to generate a drain current having a second value greater than the first value when a second drain voltage having a level greater than that of the first drain voltage is applied.

4. The synaptic element of claim 1, wherein the synaptic element is trained to generate a first drain current when a first gate voltage pulse is applied to the gate electrode, and wherein, when the number of the first gate voltage pulses increases, the synaptic element is trained such that the first drain current increases linearly by a first value in proportion to an increase in the number of the first gate voltage pulses.

5. The synaptic element of claim 4, wherein the synaptic element is trained to generate a second drain current when a second gate voltage pulse different from the first gate voltage pulse is applied to the gate electrode, and wherein, when the number of the second gate voltage pulses increases, the synaptic element is trained such that the second drain current decreases linearly by a second value in proportion to an increase in the number of the second gate voltage pulses.

6. The synaptic element of claim 5, wherein a polarity of the second gate voltage pulse is opposite to that of the first gate voltage pulse.

7. The synaptic element of claim 5, wherein an intensity of the second gate voltage pulse is the same as an intensity of the first gate voltage pulse, and wherein the second value is the same as the first value.

8. The synaptic element of claim 4, wherein the synaptic element is trained to generate a third drain current when a third gate voltage pulse having a pulse intensity lower than that of the first gate voltage pulse is applied to the gate electrode, and wherein, when the number of the third gate voltage pulses increases, the synaptic element is trained such that the third drain current linearly increases by a third value less than the first value in proportion to an increase in the number of the third gate voltage pulses.

9. An electronic circuit comprising:

a synaptic element; and a variable resistor, and wherein the synaptic element includes:

a gate electrode connected to an input terminal;

a first electrode;

a second electrode connected to one end of the variable resistor and an output terminal; and a multilayer tunnel insulating film in contact with each of the gate electrode, the first electrode, and the second electrode, and disposed such that the gate electrode is spaced apart from the first electrode and the second electrode, and wherein the synaptic element generates a tunneling current flowing from the first electrode to the gate electrode through the multilayer tunnel insulating film based on a gate voltage pulse applied to the gate electrode through the input terminal, wherein the synaptic element operates in one of a turn-on mode, a turn-off mode, and an intermediate mode different from the turn-on mode and the turn-off mode based on the tunneling current, wherein the synaptic element is trained to generate a drain current in each of the turn-on mode, the turn-off mode, and the intermediate mode, and wherein the synaptic element controls an output voltage output to the output terminal through the second electrode based on the drain current and a resistance value of the variable resistor.

10. The electronic circuit of claim 9, wherein a drain voltage is applied to the first electrode, and wherein a magnitude of the drain current generated based on the gate voltage pulse varies depending on a level of the drain voltage.

11. The electronic circuit of claim 10, wherein the synaptic element generates a drain current having a first value when a first drain voltage is applied, and wherein the synaptic element is trained to generate a drain current having a second value greater than the first value when a second drain voltage having a level greater than that of the first drain voltage is applied.

12. The electronic circuit of claim 10, wherein, when the resistance value of the variable resistor increases and a first drain voltage is applied to the first electrode, the synaptic element allows a first output voltage having a first intensity to be output to the output terminal, and wherein, when the resistance value of the variable resistor increases and a second drain voltage having an intensity lower than that of the first drain voltage is applied to the first electrode, the synaptic element allows a second output voltage having a second intensity lower than the first intensity to be output to the output terminal.

13. The electronic circuit of claim 9, wherein the synaptic element is trained to generate a first drain current when a first gate voltage pulse is applied to the gate electrode, and wherein, when the number of the first gate voltage pulses increases, the synaptic element is trained such that the first drain current increases linearly by a first value in proportion to an increase in the number of the first gate voltage pulses.

14. The electronic circuit of claim 13, wherein the synaptic element is trained to generate a second drain current when a second gate voltage pulse different from the first gate voltage pulse is applied to the gate electrode, and wherein, when the number of the second gate voltage pulses increases, the synaptic element is trained such that the second drain current decreases linearly by a second value in proportion to an increase in the number of the second gate voltage pulses.

15. The electronic circuit of claim 14, wherein a polarity of the second gate voltage pulse is opposite to that of the first gate voltage pulse.

16. The electronic circuit of claim 14, wherein an intensity of the second gate voltage pulse is the same as an intensity of the first gate voltage pulse, and wherein the second value is the same as the first value.

17. The electronic circuit of claim 13, wherein the synaptic element is trained to generate a third drain current when a third gate voltage pulse having a pulse intensity lower than that of the first gate voltage pulse is applied to the gate electrode, and wherein, when the number of the third gate voltage pulses increases, the synaptic element is trained such that the third drain current linearly increases by a second value less than the first value in proportion to an increase in the number of the third gate voltage pulses.

* * * * *